United States Patent [19]  [11] 4,296,424
Shibasaki et al.  [45] Oct. 20, 1981

[54] COMPOUND SEMICONDUCTOR DEVICE HAVING A SEMICONDUCTOR-CONVERTED CONDUCTIVE REGION

[75] Inventors: Ichiro Shibasaki; Kaoru Ohmura; Takeo Kimura, all of Fuji, Japan

[73] Assignee: Asahi Kasei Kogyo Kabushiki Kaisha, Osaka, Japan

[21] Appl. No.: 22,916

[22] Filed: Mar. 22, 1979

[30] Foreign Application Priority Data

Mar. 27, 1978 [JP] Japan .................................. 53-34062
Mar. 27, 1978 [JP] Japan .................................. 53-34063
Aug. 9, 1978 [JP] Japan .................................. 53-96114

[51] Int. Cl.³ .................... H01L 27/24; H01L 45/00; H01L 23/48
[52] U.S. Cl. .......................................... 357/1; 357/2; 357/65; 357/67; 357/68; 174/68.5
[58] Field of Search ...................... 357/2, 6, 1, 67, 68; 357/65; 148/6.3; 174/68.5

[56] References Cited

U.S. PATENT DOCUMENTS

| | | | |
|---|---|---|---|
| 3,271,591 | 9/1966 | Ovshinsky | 357/2 |
| 3,634,927 | 1/1972 | Neale et al. | 357/2 |
| 3,716,844 | 2/1973 | Brodsky | 357/2 |
| 3,920,485 | 11/1975 | Ansell et al. | 148/6.3 |
| 4,017,890 | 4/1977 | Howard et al. | 174/68.5 |
| 4,081,601 | 3/1978 | Dinella et al. | 174/68.5 |

*Primary Examiner*—Andrew J. James
*Attorney, Agent, or Firm*—Sprung, Felfe, Horn, Lynch & Kramer

[57] ABSTRACT

In a compound semiconductor device such as a magnetoresistance element or Hall element having a compound semiconductor portion such as of InSb and an electrode portion, a portion of the compound semiconductor portion is exposed to energy irradiation to be converted into an alloy state or amorphous state and rendered conductive to form the electrode portion. The portion rendered conductive is contiguous to and in ohmic contact with the unexposed portion of the compound semiconductor and used as a shorting bar electrode or an external lead bonding pad.

20 Claims, 12 Drawing Figures

COMPOUND SEMICONDUCTOR DEVICE HAVING A SEMICONDUCTOR-CONVERTED CONDUCTIVE REGION

BACKGROUND OF THE INVENTION

The present invention relates to a compound semiconductor device and a method for producing the same and more particularly, it relates to a novel electrode forming technique for compound semiconductor devices such as semiconductor magnetoelectric transducers.

The magnetoelectric transducer made from a semiconductor thin film material such as a Hall element and a magnetoresistance element has been usually produced such that the sensitive portion of these elements and electrodes are formed by plating on vapor deposition of the conducting metal electrode materials forming the special pattern of the conducting electrode materials on the semiconductor thin film surface. The electrode member herein referred to implies a bonding pad for external connection of the element and the internal electrode on the sensitive portion of the element such as the shorting bar electrode of the magnetroresistance element. This type of electrode member is required to be in ohmic contact with the semiconductor thin film and is usually prepared in the form of a multi-thin layer, two or three layer structure, made of difficult conducting metals. For example, a multi-layer electrode of different conducting metals such as Ni-Cu-Au, Ge-Au, Cu-Au, Cu-Ag or the like, not only ensures the necessary ohmic contact with the semiconductor portion of the device but also ensures to prevent the electromigration of the electrode metals to the semiconductor portion prone to occur in the use of the element and to guard the semiconductor thin film in solder bonding process. A proposal to prevent the electromigration from the multi-layer electrode is disclosed in, for example, U.S. Pat. No. 4,081,601 to Donald Dinella et al, entitled "BONDING CONTACT MEMBERS TO CIRCUIT BOARDS". Such metallic materials as Ni-Cr or Cu serve an important role in providing the ohmic contact, a reinforcement, an oxidation-preventing barrir and a guard layer against the electromigration. In the conventional production of magnetoelectric transducers as mentioned above, however, the electrode formation required various sophisticated and troublesome processes including wet processes and dry processes. Especially, the conventional electrode formation process needs several times electroless plating processes which adversely affect a semiconductor thin-film device being produced so that it was inevitable to cause the migration as well as contamination due to the migration of impurities from the electrode portion to the semiconductor functional portion of the device during the production thereof. The semiconductor devices thus produced have poor reliability because of the complex production process explained above. In addition, a number of fabrication steps as required increase production cost.

SUMMARY OF THE INVENTION

An object of the present invention is to provide a compound semiconductor device having a novel electrode structure, in which a compound semiconductor layer is partly changed conductive by transforming the solid phase state of the semiconductor without doping impurities, and a method for producing the same.

Another object of the present invention is to provide a compound semiconductor device having an electrode made from a compound semiconductor thin film which is converted into alloy or amorphous state and is in ohmic contact with a semiconductor functional portion of the device, and a method for making the same.

Still another object of the present invention is to provide a novel electrode structure for a compound semiconductor device in ohmic contact with a semiconductor portion which can be prepared with a reduced number of layers of metallic multi-layer and of plating processes and which can prevent the migration.

Another object of the present invention is to provide a method for producing a compound semiconductor device comprising an impurity-doping-free process and a dry process in forming a high conductivity region in a compound semiconductor layer. A further object of the present invention is to provide an electrode structure which is advantageously applicable to Hall element and a magnetroresistance element and a method for making the same.

The inventors have found a phenomenon in which when a suitable amount of intense light is irradiated onto the surface of a thin film of group III-V compound semiconductors, the compound semiconductor undergoes a permanent change in its solid phase state at the exposed portion, causing a change in the energy band structure of the semiconductor material. The exposed portion or region is considerably decreased in resistance to exhibit the property of high conductivity like metals, whereas the unexposed portion of the region maintains the properties of semiconductor. Besides, at the interfaces or boundaries between exposed and unexposed portions, excellent ohmic contact takes place. The present invention is based on this phenomenon.

Specifically, the compound semiconductor layer is changed conductive by the intense pulse light irradiation from a xenon discharge lamp. This is assumed to be based on the fact that a portion of compound semiconductor layer exposed to the light energy irradiation changes its electrical conductivity to a great extent. This is due to the change in the solid phase state of compound semiconductor materials. The semiconductor of the exposed portion changes to alloy state or amorphous state, reducing the resistivity. The ability to convert the exposed portion to substantially conductor is drastic with a compound semiconductor in the form of a thin film. Even with a compound semiconductor bulk, it is possible to provide such a conductive region which forms good ohmic contact with an unexposed portion.

The change of the electrical conductivity of the semiconductor is supposed that the compound semiconductor loses its original and inherent properties when irradiated with crystal lattice-damaging by high energy radiation or particles, and is changed to the alloy state or amorphous state. The affinity for ohmic contact between the unexposed compound semiconductor portion and the exposed conductive portion is of a great interest and at the same time is important in putting the electrode structure of compound semiconductor device according to the invention in practice.

According to the present invention, in forming the electrode of the compound semiconductor device, there is no need of providing an electrode metal of the conventional multi-layer which makes ohmic contact to a semiconductor portion of the device. Therefore, the electroless plating is not required to deposit the electrode metal for ohmic contact. Thus, the degradation in capabilities of the semiconductor portion is minimized which would be caused by the contamination due to impurity migration from the electrode portion to the semiconductor portion during the electroless plating process and by the migration or damaging in the wire bonding process.

Moreover, according to the present invention, in forming the electrode of the device, such an electroless plating process as executed several times to prepare the conventional multi-layer structure is dispensed with by using the electrode portion formed by single energy irradiation, thereby simplifying the process necessary for forming the electrode and doing away with disposal of polluted plating wastage. Accordingly, the present invention can afford to provide a compound semiconductor device having a highly reliable electrode structure which is suitable for mass production with minimized defective products.

DESCRIPTION OF THE PREFERRED EMBODIMENTS

Figure 1:
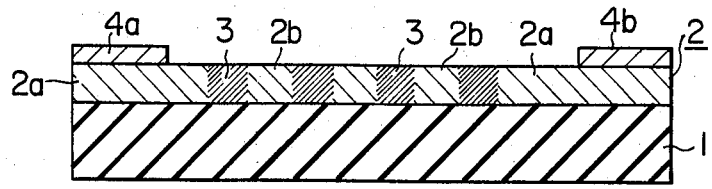
FIG. 1 is a section view of one embodiment of a compound semiconductor magnetoresistance element with shorting bar electrodes to which this invention is applied.

A compound semiconductor device has its typical application to magnetoresistance elements and reference is first made to FIG. 1 showing, in section, an embodiment of a magnetoresistance element incorporating the present invention. As shown therein, a compound semiconductor thin film 2 is deposited on one surface of an insulating substrate 1 to forma magnetic field sensitive portion of the element. Regions 3 in the compound semiconductor thin film 2 correspond to layers converted into conductor material such that the compound semiconductor thin film 2 subjected to energy irradiation changes in its solid phase state. Thus, the regions form stripe shorting bar electrodes. These shorting bar electrodes 3 are contiguous to semiconductor portions or regions 2a and 2b, making ohmic contact thereto. Bonding pads (electrodes) 4a and 4b of metal material are disposed on the surface of the semiconductor regions 2a to make ohmic contact thereto and the shorting bar electrodes 3 are interpositioned therebetween. The bonding pads 4a and 4b form bonding sites or areas for connector contacts.

Figure 2:
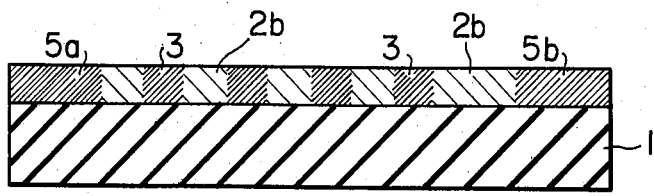
FIG. 2 is a section view of a modified embodiment of FIG. 1 in which this invention is also applied to electrodes for external connection.

The external connection electrodes of FIG. 1 may be modified as shown in FIG. 2 according to the present invention. More particularly, in place of the external connector contacting metals bonded to the surface of the semiconductor thin film regions 2a, this modification comprises bonding pad electrodes 5a and 5b produced by converting the compound semiconductor thin film 2 to substantially conductor at the corresponding portions thereof simultaneously with the formation of the shorting bar electrodes 3. Thus, the electrodes 5a and 5b are impurity-doping-free, solid phase-converted conductive regions, like shorting bar electrodes 3, and are contiguous to semiconductor regions 2b, making ohmic contact thereto.

Figure 3A:
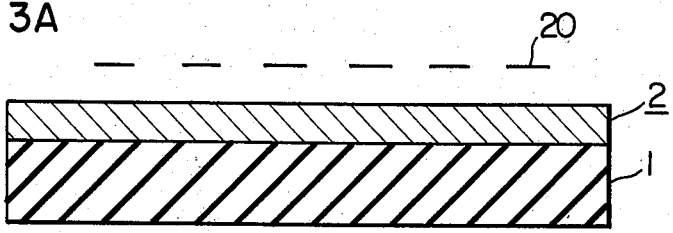
FIGS. 3A and 3B are diagrammatic representations useful to explain fabrication steps for the element of FIG. 2.
Figure 3B:
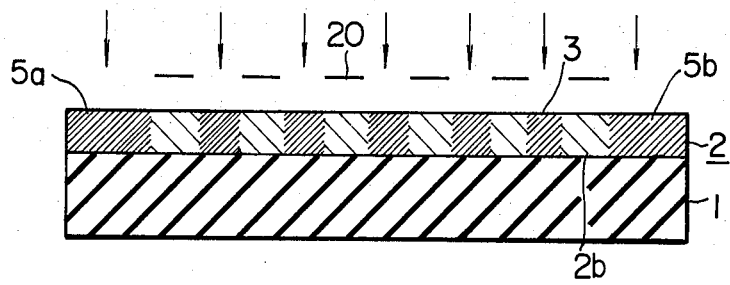

Referring to FIGS. 3A and 3B, a method of fabricating the magnetoresistance element of FIG. 2 will be described in general.

The insulating or dielectric substrate 1 is one conventionally used for this type of element. The substrate 1 is first prepared by depositing or adhering the compound semiconductor thin film 2 to one surface of the insulating substrate 1. A selection mask 20 having a pattern corresponding to a desired electrode configuration is then positioned to the substrate in close contact thereto (FIG. 3A).

Thereafter, the semiconductor film attached to substrate 1 is irradiated through the mask 20 with a high intensity energy radiation as shown by arrows in FIG. 3 from an energy source (not shown), for example, a xenon discharge lamp device. As a result, portions or regions of the semiconductor thin film 2 exposed to the energy irradiation change their solid phase states and exhibit conductive properties. These regions form the electrodes 3, 5a and 5b. Regions 2b of the compound semiconductor thin film unexposed to the energy irradiation remain unchanged in their original properties. As an alternative of the xenon discharge lamp exposure, the compound semiconductor thin film may be scanned with an energy beam.

Figure 4:
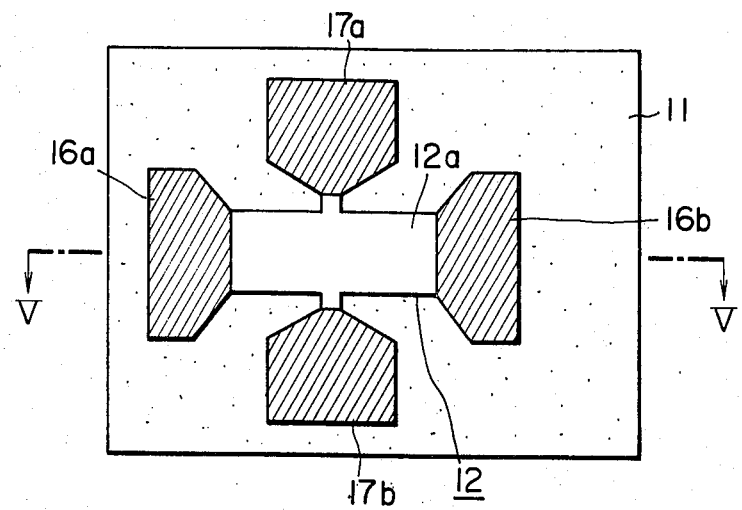
FIG. 4 is a plan view of one embodiment of a compound semiconductor Hall element incorporating this invention.
Figure 5:
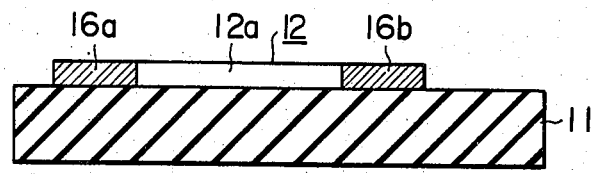
FIG. 5 is a sectional view of FIG. 4 taken along the line V—V thereof.

Another typical example of a magnetoelectric transducer is a criss-cross pattern semiconductor Hall element. A criss-cross pattern semiconductor Hall element embodying the invention as shown in FIGS. 4 and 5 comprises an insulating substrate 11 and a compound semiconductor thin film 12 disposed thereon. Portions of the thin film, that is, energy irradiated or exposed portions which are changed conductive thereby form electrodes 16a, 16b, 17a and 17b contiguous to ends of the criss-cross, making ohmic contact thereto. These electrode portions are not doped with impurity to be conductor regions. An unexposed portion 12a forms a current-carrying portion, that is, a magnetic field sensitive portion. These electrodes serves as external connection electrodes or bonding pads, of which electrodes 16a and 16b are input electrodes standing for control current electrodes and the other electrodes 17a and 17b are Hall voltage output electrodes.

A general description will be given of the magnetoelectric transducer as exemplified in the foregoing embodiments.

The magnetoelectric transducer, which is one specified form of the compound semiconductor device, is generally termed herein as including Hall elements, Hall-effect devices or magnetoresistance elements utilizing the semiconductor. This magnetoresistance element includes various types utilizing magnetoresistance effect such as ordinary magnetoresistor, three-terminal magnetoresistance element and Corbino disc element.

The electrode herein defined by the invention represents, as described above, the portion of the compound semiconductor at which the semiconductor is changed in its solid phase state by energy irradiation without doping additional impurity and changed conductive, and takes the form of the lead (wire) bonding pad and shorting bar electrode. In addition, the wire bonding pad stands for the external lead connecting electrode or connector contact area of the element and the shorting bar electrode is adapted to control characteristics of the magnetoresistance element and usually disposed within the magnetic field sensitive portion of the element. The configuration, location, size and thickness (depth) of the shorting bar electrode are desirably determined depending on the type of the element and characteristics thereof. It is usually intended to improve the magnetic field sensitivity by using an ohmic contact stripe electrode as the shorting bar electrode. Alternatively, the shorting bar electrode may take various patterns such as a slit, curved line, folded line, or closed curve. It should be appreciated that the technique as disclosed in U.S. Patent application Ser. No. 964,554 corresponding to Japanese Patent application No. 52-142240 entitled "Semiconductor Magnetoresistive Element Having A Differential Effect" by the same applicants, filed Nov. 29, 1978, assigned to the assignee of the present application, is applicable to materialize variety of the magnetoresistance elements.

The compound semiconductor for use in the magnetoelectric transducer according to the invention is preferably formed into a thin film. Preferably, it includes compound semiconductors mainly containing group III and group V elements in the periodic table, for example, InSb, InAs, InP, InN, GaP, GaAs, GaSb, GaN, AlAs, AlSb, AlP, AlN, BSb, BAs, BN, InGaSb, InSbSn, InSb-NiSb, GaAsP, GaAlAs, and InGaP.

The thin film referred to in the foregoing embodiments stands for the semiconductor layer usually employed in the magnetoelectric transducer and typically having a thickness ranging from $0.1\mu$ to $100\mu$. The semiconductor layer may include a thin film prepared by lapping or polishing single crystal, polycrystal, eutectic and amorphous semiconductors, a layer prepared by evaporation, ionplating or sputtering, a semiconductor layer prepared by liquid phase growth process or vapor growth process, or a thin-layer according to U.S. Pat. No. 4,128,681.

In forming the electrode, the portion i.e., selected region of the compound semiconductor layer is exposed to energy irradiation and thus constantly rendered highly conductive while making ohmic contact to the unexposed portion of the semiconductor layer. The selected region thus formed corresponds to the electrode. Conditions of the energy irradiation are preferably determined such that the portion changed conductive has an electrically conductivity which is not less than ten times that of the semiconductor. As generally available energy irradiation source other than the xenon discharge light exposure as referred to in connection with the foregoing embodiments, laser beams, electron beams, or hot rays (or heat rays) may also be used, but these beams and rays disadvantageously rely on sophisticated and expensive exposure-irradiation devices.

The amount of the energy irradiation has an optimum range determined depending on type, topography, thickness and physical strength of the compound semiconductor layer, geometry of the region rendered conductive, and strength of the substrate. The energy amount below the optimum range fails to render the semiconductor layer conductive and in contrast, the layer exposed in an energy amount exceeding the optimum range will be damaged. The amount of energy irradiation necessary for converting the layer to conductor depends on the product of energy intensity and irradiation time. Accordingly, the irradiation energy dosage can be controlled by adjusting energy intensity and/or irradiation time. Based on this, it is possible to render the semiconductor thin film conductive to a desired depth from the surface thereof. In order to make the electrode of a fine pattern, it is preferable to increase the energy intensity and at the same time to decrease the irradiation time. Briefly, an energy mode is required which meets preventing the substrate from being damaged and instantly melting the exposed portion of the semiconductor layer without raising temperatures in the unexposed surrounding portion.

Since parameters of conditions determining the optimum value or range of the energy dosage are determinable case by case, the value or range is specifically estimated by a trial under the corresponding conditions.

As will be seen from comparison of FIG. 1 with FIG. 2, patterning for different electrodes can easily be accomplished by using masking or beam scanning technique well known in the art.

A description given below is to explain how to connect the external lead wire to the connector contact electrode or bonding pad prepared in accordance with the present invention. For the intended bonding, the external lead wire may be bonded to the pad by, for example, soldering, wire-boinding or face-down bonding as usual. Preferably, for electrically connecting the external lead-out conductor, conductive polymer adhesives may be used which are activated at low temperatures. Such conductive polymer adhesives are available at hand as a commercialized conductive resin paste or a home-made conductive resin as desired. For preparing the latter, fine powder particles of a metal such as Ag, Au, Cu, Ni or Pd are mixed with a binder such as epoxy resin, polyamideimide resin or acryl resin. The resulting mixture is conductive.

Referring to FIGS. 6 to 10, embodiments of external lead-out electrode connection structure of the compound semiconductor device will be described.

Figure 6:
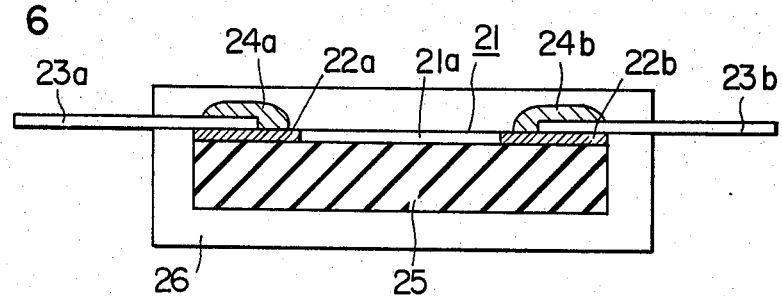
FIGS. 6 and 10 are section views of magnetoelectric transducers illustrating various modifications of the connection between external connection electrodes and lead wires.

FIG. 6 shows, in section, a resin mold package encapsulating a Hall element. A compound semiconductor layer 21 deposited on an insulating substrate 25 has partly non-doped, radiation-converted conductive regions 22a and 22b (that is, impurity-doping-free regions rendered conductive by energy irradiation). The regions 22a and 22b constitute external lead-out connection electrodes and a non-converted (unexposed to energy irradiation) portion 21a of the semiconductor layer 21 constitutes a magnetic field sensitive portion. External lead-out conductors 23a and 23b are held in intimate contact with the electrodes 22a and 22b, respectively, and firmly secured thereto by conductive polymer adhesives 24a and 24b. The compound semiconductor layer 21 is normally thin and advantageously, it is supported by the substrate 25. The outer surface of the semiconductor layer 21, not in contact with the surface of the substrate 25, is sensitive to ambient dusts or scratching and if uncovered, it will be damaged. Accordingly, a protective layer is used to cover the outer surface as in ordinary semiconductor devices. In an illustration of FIG. 6, the Hall element as a whole is encapsulated with epoxy resin 26.

Figure 7:
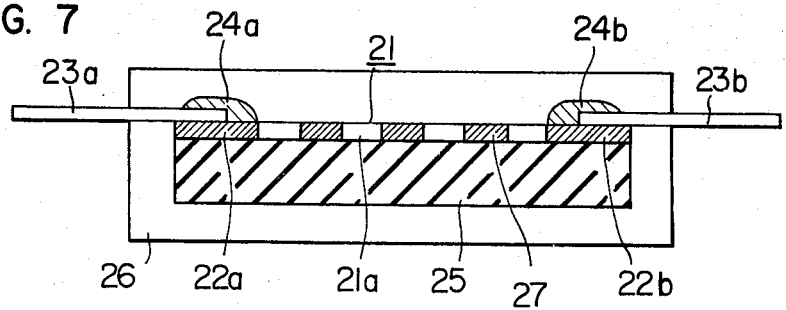

FIG. 7 shows, in section, a resin mold package encapsulating a magnetoresistance element. In addition to non-doped, radiation-converted conductive external lead-out connecting electrodes 22a and 22b, a compound semiconductor layer 21 is provided with similar conductive regions constituting shorting bar electrodes 27. A bonding structure for lead-out conductors are similar to that of FIG. 6.

Figure 8:
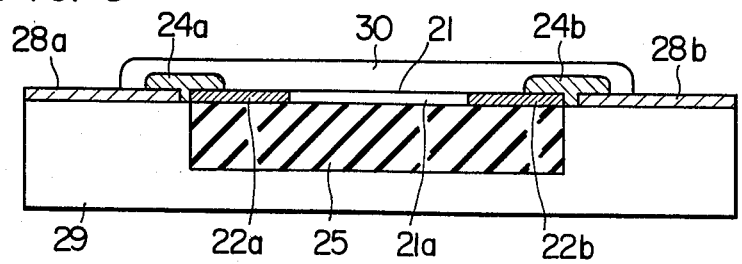

FIG. 8 shows a modification of FIG. 6, wherein a substrate 25, a compound semiconductor layer 21 supported thereby, and non-doped, radiation-converted conductive electrodes 22a and 22b are embedded in a mold substrate 29, and conductor films 28a and 28b and the conductor films 28a and 28b are connected to the electrodes 22a and 22b, respectively, through conductive polymer layers 24a and 24b. The electrodes along with connections therefor and the compound semiconductor are covered with a protective film 30.

Figure 9:
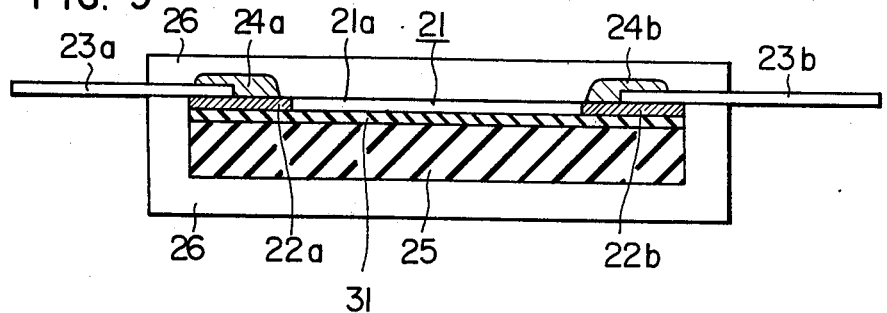

FIG. 9 shows another modification of FIG. 6, wherein a compound semiconductor thin film 21, non-doped, radiation-converted conductive bonding pads 22a and 22b, lead-out conductors 23a and 23b connected to the pads, and conductive polymer portions 24a and 24b are similar to those of FIG. 6 but an insulating layer 31 is interposed between a substrate 25 and the semiconductor layer 21. This insulating layer 31 not only facilitates steady isolation of the semiconductor thin film 21 from the substrate but also serves as a guard layer against migration of impurities from the substrate to the semiconductor thin film, as will be detailed later.

Figure 10:
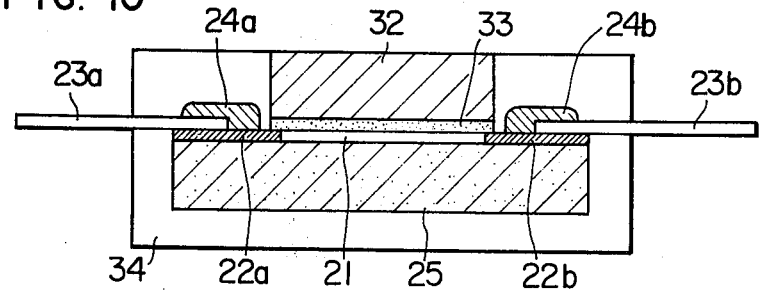

The magnetoelectric transducer incorporating the present invention can be modified as shown in FIG. 10, wherein it is intended to enhance magnetic field sensitivity by converging the magnetic field. To this end, a magnetic field converging chip 32 made of a ferromagnetic material is bonded to the surface of a compound semiconductor thin film 21 by an adhesive 33, for example. A substrate 25 is also made of a ferromagnetic material. The thus formed transducer assembly is encapsulated with a mold resin 34. The substrate 25 can be of a non-magnetic material as in the modification of FIG. 9.

The magnetic field converging chip 32 as well as the substrate is preferably of a large saturation magnetic flux density, ferromagnetic material such as pure iron, permalloy, or ferrite. The chip may take the form of a rectangular plate, disc or column and may be dimensioned as required. Generally speaking, symmetrically geometry is preferable since it owns linear magnetic field convergency. Electrodes are similar to those of FIG. 6, FIG. 7 or FIG. 9. The transducer assembly is then encapsulated with resin mold 34 but the chip 32 may otherwise be fabricated to meet encapsulation.

When desired to be non-magnetic, the substrate 25 may be made of a metal plate whose surface is applied with insulation treatment or coated with glass, ceramic or sapphire. For insulation treatment and inhibition against impurity migration into the semiconductor thin film, it is desirable that the surface of the substrate has a coating which is prepared by polymer coating, sputtering, vacuum-evaporation, or ion-plating.

Figure 11:
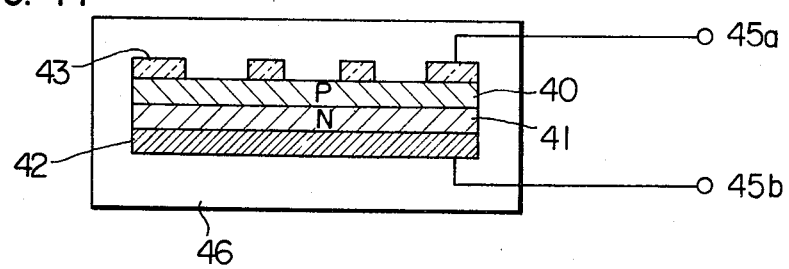
FIG. 11 is a section view of one embodiment of a compound semiconductor solar cell to which this invention is applied.

FIG. 11 shows an example of a solar cell having an electrode structure according to the present invention. The solar cell device comprises a p-type compound semiconductor layer 40, an n-type compound semiconductor layer 41 provided to form a pn junction with the layer 40 at their boundary. One electrode 42 is formed over the surface of the semiconductor layer 41. The electrode 42 is formed by changing a portion of the compound semiconductor material of the layer 41 to conductor with intense light irradiation. The other electrode 43 of transparent mesh type is provided on the semiconductor layer 40 to constitute a light receiving surface for the cell. Lead wires 45a and 45b are bonded to the transparent electrode 43 and the irradiation-converted conductive electrode 42, respectively. The cell assembly is encapsulated by mold resin 46 to complete the cell device.

It will be understood that the present electrode structure produced by changing the solid phase state of a compound semiconductor using appropriate energy irradiation is widely applicable to other semiconductor devices such as light reception diodes having compound semiconductors therein.

The following Examples 1 and 2 are actual products of magnetoresistance element according to the embodiment of FIG. 2.

EXAMPLE 1

An InSb deposit strip layer of 20,000 cm$^2$/v·sec electron mobility, 1$\mu$ thickness, 4 mm length and 0.4 mm width was formed on a ferrite substrate of 0.5 mm thickness, 2 mm width and 5 mm length.

Thereafter, a Cr selection mask prepared by vapor-depositing Cr on a glass plate or a selection mask prepared by vapor-depositing Ag on a polymer film was placed on the InSb deposit layer in close contact therewith and intense light of 100$\mu$ sec pulse width emitted from an irradiation source of a xenon discharge lamp which is disposed above the mask was irradiated onto the InSb layer under atmospheric pressure at room temperature. The xenon discharge lamp had a rating input voltage of 3,000 V and a minimum discharge pulse width of 50$\mu$ sec. In this manner, thirty shorting bar electrodes 3 having each 50$\mu$ width and mutually spaced apart 50$\mu$, and bonding pads 5a and 5b having each 0.4 mm width and 0.5 mm length and located at longitudinally opposite ends of the InSb deposit strip layer were formed, as shown in FIG. 2, simultaneously and instantly by discharge light energy irradiation from the xenon discharge lamp without relying on impurity doping. The xenon discharge irradiation was free from specific conditions so that it was carried out under atmospheric pressure at room temperature, without causing any troubles. Lead-out conductors were bonded to the bonding pads, and a magnetoresistance element thus formed on the substrate was suitably encapsulated by epoxy resin to complete a product.

To compare the product of Example 1 with a product according to the conventional method, shorting bar electrodes and bonding pads, especially multi-layer bonding pads, were patterned on the same InSn deposit layer as in Example 1 by plating and lead-out conductors were bonded to the bonding pads, completing a magnetoresistance element according to the conventional method. The shorting bar electrodes of this element were patterned in the same fashion as Example 1 and had two layers of copper and silver. The double layer was 0.3$\mu$ in thickness. This product was encapsulated with epoxy resin. Both the control products were measured of their characteristic and reliability with the following results as indicated in Table 1.

TABLE 1

|  | Resistance increment (%) | Temperature-humidity cycle test |
|---|---|---|
| Example 1 product | 32 | 11 cycles passed |
| Conventional product | 28 | 8 cycles passed |

In Table 1, values of the resistance increment were measured under the application of 2 K gauss magnetic field and the temperature-humidity cycle tests were conducted at a cycle for 12 hours under the conditions of 60° C. and 95% relative humidity in combination and 25° C. and 60% relative humidity in combination. The above results show that the element produced according to the present invention has a larger resistance increment i.e., sensitivity and humidity-proof property than those of the element produced according to the conventional method.

EXAMPLE 2

An InSb single crystalline thin film of 70,000 cm$^2$/V.sec electron mobility, 4 mm length, 0.4 mm width and 20$\mu$ thickness was bonded to a pure iron plate substrate of 0.5 mm thickness, 2 mm width and 5 mm length through an epoxy resin insulative adhesive.

Next, as in Example 1, one-shot discharge light of 100$\mu$ sec pulse width from a xenon discharge lamp device was irradiated on the thin film through a Cr-selection mask prepared by vapor depositing Cr on a glass plate. Thus, shorting bar electrodes having each 50$\mu$ width and mutually spaced apart 50$\mu$, and bonding pads having each 0.4 mm width and 0.5 mm length and located at opposite ends of the thin film were formed simultaneously, completing a magnetoresistance element according to the present invention.

For comparison, shorting bar electrodes and bonding pads were patterned on the same InSb single crystalline thin film as in Example 2 by plating, completing a magnetoresistance element according to the conventional method. The bonding pads were patterned in the same fashion as Example 2. The plated shorting bar electrodes had two layers of copper and silver, the double layer being 0.3$\mu$ in thickness.

These control products, provided with lead-out conductors at the bonding pads and encapsulated with epoxy resin, were measured for their characteristic and reliability with the following results as indicated in Table 2.

TABLE 2

|  | Resistance increment (%) | Temperature-humidity cycle test |
|---|---|---|
| Example 2 product | 92 | 12 cycles passed |
| Conventional product | 80 | 8 cycles passed |

Measuring conditions were the same as those in Example 1.

Examples 3 and 4 are actual products of Hall element according to the embodiments of FIGS. 4 and 5.

EXAMPLE 3

On a square ferrite substrate of 0.5 mm thickness and 5 mm side was formed an InSb deposit film of 15,000 cm$^2$/V·sec electron mobility in a criss-cross pattern having electrode forming regions 16a, 16b, 17a and 17b as shown in FIG. 4.

Next, as in Example 1, a Cr-selection mask was placed on the InSb deposit film in close contact therewith and xenon discharge light was irradiated onto the film through the Cr-selection mask. The Cr-selection mask was so patterned as to permit the electrode forming regions to be exposed. The InSb deposit film was exposed to xenon discharge light at its electrode forming regions and these regions were converted into conductor material. That is to say, after exposure, the compound semiconductor layer at the electrode forming regions 16a, 16b, 17a and 17b lost semiconductor properties and exhibited high electrical conductivity. A magnetic field sensitive portion, that is, input control current carrying portion 12a was formed with 1.5 mm width and 3.0 mm length, and each output electrode was formed with 0.3 mm width, extending from the middle of each side of the magnetic field sensitive portion. Both the input and output bonding pads 16a, 16b and 17a, 17b had a large bonding area to facilitate the bonding of the external lead wires.

Thereafter, lead wires were bonded to the input electrodes 16a and 16b and the output electrodes 17a and 17b by soldering an In-Sn solder, completing a Hall element. The resulting assembly was molded with epoxy resin.

The Hall element thus produced showed an unbalance voltage of 1.2 mV under the conditions of 5 mA input control current and zero magnetic field applied. It also showed a high Hall voltage of 150 mV for 5 mA input control current and 1 K gauss magnetic flux density applied.

When subjected to a temperature-humidity test at 60° C. and 95%, the product showed a lifetime which is 20% longer than that of a conventional control product of the same configuration and having a double layer electrode of copper and silver prepared by electroless plating, providing improved reliability for a long time operation.

Example 4

On a square ferrite substrate of 0.5 mm thickness and 5 mm side was formed an InSb single crystalline thin film of 75,000 cm$^2$/V.sec electron mobility in a pattern including electrode forming regions as shown in FIG. 4, and the InSb thin film was selectively exposed to xenon discharge light in a manner similar to Example 3 to convert the Hall element electrode forming regions into electrically conductive material. Dimensions of a magnetic field sensitive portion 12 and iinput and output electrodes were the same as those of Example 3.

The Hall element thus produced was measured of its characteristic, showing an unbalance voltage of 0.3 mV for 5 mA input control current and zero magnetic field applied. It also showed a high Hall voltage of 50 mV for 5 mA input control current and 1 K gauss magnetic flux density. Moreover, when subjected to a proof test at high temperature and humidity, the product showed high reliability similar to Example 3.

Example 5

This example is a modified product according to the FIG. 4 Hall element. On a square ferrite substrate of 00.5 mm thickness and 5 mm side was formed an InSb deposit film of 1.0 $\mu$ thickness and 15,000 cm$^2$/V·sec electron mobility in a criss-cross pattern having electrode forming regions as shown in FIG. 4.

Next, an exposure mask was prepared by vapor depositing silver on a PET (polyethylene glycol terephalate) plate in 0.2 μ thickness and etching off the corresponding electrode forming regions of the criss-cross pattern. The InSb deposit film was exposed to xenon discharge irradiation through the exposure mask in a manner similar to Example 1 to form input and output electrodes of a magnetic field sensitive portion having the same dimensions as those of the previous Example. Lead wires were bonded to these electrodes by conductive resin paste H-310 made by Epoxy Technology Corporation, applied at portions as designated at 24a and 24b in FIG. 6, and the resulting assembly was encapsulated with epoxy resin.

The Hall element thus produced showed an unbalance voltage of 1.2 mV for 5 mA input control current and zero magnetic field applied as well as a Hall voltage of 150 mV for 5 mA input control current and 1 K gauss magnetic flux density.

As a result of comparing 500 samples according to this example having the external leads connected to the electrodes by means of conductive polymer with the same number of samples according to the conventional method having the lead connections by means of soldering, the former was 7% in the percentage of fault products while the latter was 32%.

What is claimed is:

1. A compound semiconductor device comprising a functional portion of a compound semiconductor mainly comprising a group III-V compound semiconductor and an electrode portion connected to said semiconductor functional portion, wherein said electrode portion comprises a region of the compound semiconductor in which the material of said compound semiconductor is changed in the solid phase state to cause a change in its energy band structure and is thereby converted to a conductor in ohmic contact with the contiguous portion of the compound semiconductor.

2. A compound semiconductor device according to claim 1 wherein said electrode portion has an alloy state subject to the deformation of crystalline lattice of the compound semiconductor material.

3. A compound semiconductor device according to claim 1 wherein said electrode portion has an amorphous state resulting from the conversion of solid phase of the compound semiconductor material to act as a conductor.

4. A compound semiconductor device according to claim 1, 2 or 3 wherein said electrode portion forms an external lead bonding pad.

5. A compound semiconductor device according to claim 1, 2 or 3 wherein said electrode portion forms a shorting bar electrode.

6. A compound semiconductor device according to claim 1 wherein said electrode portion comprises external lead connection electrodes and shorting bar electrodes.

7. A compound semiconductor device according to claim 1, 2, 3 or 6 wherein an external lead connection electrode of said electrode portion is bonded to an lead-out conductor by a conductive polymer adhesive.

8. A compound semiconductor device according to claim 1, 2, 3 or 6 wherein the thickness of said compound semiconductor portion ranges from 0.1 to 100 μ.

9. A compound semiconductor device according to claim 1, 2, 3 or 6 wherein said compound semiconductor portion comprises a group III - V compound semiconductor.

10. An electrode structure for use in a compound semiconductor device including a compound semiconductor layer and a conductive region, said conductive region comprising a material phase-converted region at which said compound semiconductor layer is partly converted to a conductor by the change of its solid phase state by energy irradiation, said conductive region being contiguous to said semiconductor layer and in ohmic contact therewith.

11. An electrode structure according to claim 10 wherein said region extends from at least the surface of said semiconductor layer in the thickness direction thereof.

12. An electrode structure according to claim 10 or 11 wherein the exposed surface of said region provides a bonding area for a lead-out conductor and said region prevents the migration due to bonding of said lead-out conductor.

13. An InSb thin-film magnetoelectric transducer comprising:
a dielectric substrate,
an InSb thin-film layer provided on said substrate, and
a plurality of electrodes contiguous to and in ohmic contact with said InSb layer, said electrode having a conductive layer made from said InSb layer by energy irradiation.

14. An electrode structure according to claim 11, wherein said region extends from the surface of said semi-conductor layer in the thickness direction thereof without reaching the opposite surface of said semiconductor layer.

15. An electrode structure according to claim 10, 11 or 14, wherein said semiconductive layer is formed of a group III-V compound semiconductor, InSbSn or InSb-NiSb.

16. A conductor structure formed in a compound semiconductor device, comprising:
a compound semiconductor layer including therein a functional unit of said device;
a conductive region integrated in said compound semiconductor layer in ohmic contact therewith; and
wherein said conductive region is formed from a compound semiconductor-converted region in which that portion of said compound semiconductor layer corresponding in position to said conductive region is converted to a conductor due to the change of its solid phase by the application of energy.

17. The conductor structure according to claim 16, wherein said conductive region constitutes an electrode for the device.

18. The conductor structure according to claim 16 or 17, wherein said compound semiconductor is a group III-V compound semiconductor.

19. The conductor structure according to claim 16 or 17, wherein said compound semiconductor is InSbSn.

20. The conductor structure according to claim 16 or 17, wherein said compound semiconductor is InSb-NiSb.

* * * * *